United States Patent
Cheng et al.

(10) Patent No.: US 9,305,978 B2
(45) Date of Patent: Apr. 5, 2016

(54) METHOD OF MAKING ORGANIC LIGHT EMITTING DIODE ARRAY

(71) Applicants: Tsinghua University, Beijing (CN); HON HAI PRECISION INDUSTRY CO., LTD., New Taipei (TW)

(72) Inventors: Jung-An Cheng, New Taipei (TW); Liang-Neng Chien, New Taipei (TW); Dong An, Beijing (CN); Zhen-Dong Zhu, Beijing (CN); Chang-Ting Lin, New Taipei (TW); I-Wei Wu, New Taipei (TW); Qun-Qing Li, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/470,942

(22) Filed: Aug. 28, 2014

(65) Prior Publication Data
US 2015/0155339 A1 Jun. 4, 2015

(30) Foreign Application Priority Data
Nov. 29, 2013 (CN) .......................... 2013 1 0619394

(51) Int. Cl.
*H01L 21/00* (2006.01)
*H01L 27/32* (2006.01)
*H01L 51/56* (2006.01)
*H01L 51/00* (2006.01)

(52) U.S. Cl.
CPC ........ *H01L 27/3211* (2013.01); *H01L 51/0002* (2013.01); *H01L 51/56* (2013.01)

(58) Field of Classification Search
CPC . H01L 27/3211; H01L 51/0002; H01L 51/56; H01L 27/3246; H01L 27/3244; H01L 27/326; H01L 51/52; H01L 51/5012; H01L 51/5088; H01L 51/5016; H01L 51/504; H01L 51/503; H01L 2924/00; H01L 2924/12041; H01L 33/20; H01L 33/38; H01L 33/24; H01L 33/066; H01L 2251/558; H01L 2251/5338; G09G 3/3233; G09G 2300/0426; G09G 2300/0439

See application file for complete search history.

(56) References Cited

U.S. PATENT DOCUMENTS

| | | | | |
|---|---|---|---|---|
| 5,925,259 A * | 7/1999 | Biebuyck | ................. | B41K 1/00 216/10 |
| 5,937,758 A * | 8/1999 | Maracas | ................ | B82Y 10/00 101/327 |
| 6,468,819 B1 * | 10/2002 | Kim | ..................... | H01L 27/3281 438/22 |
| 6,929,762 B2 * | 8/2005 | Rubin | ................... | B29C 59/002 264/293 |

(Continued)

*Primary Examiner* — Brett Feeney
*Assistant Examiner* — Sophia Nguyen
(74) *Attorney, Agent, or Firm* — Novak Druce Connolly Bove + Quigg LLP

(57) ABSTRACT

A method of making organic light emitting diode array includes following steps. A base having a number of first electrodes on a surface of the base is provided. A first organic layer is located on the surface of the base to cover the number of first electrodes. A first organic light emitting layer is applied on the first organic layer. A template with a first patterned surface with a number of grooves with different depths is provided. The template is attached on the first organic light emitting layer and separated from each other, wherein a number of protruding structures with different heights is formed. A second organic light emitting layer is deposited on a part of the plurality of protruding structures. A second organic layer is located on the organic light emitting layer. A second electrode is applied to electrically connect to the second organic layer.

19 Claims, 3 Drawing Sheets

(56) References Cited

U.S. PATENT DOCUMENTS

| | | | | |
|---|---|---|---|---|
| 6,957,608 B1* | 10/2005 | Hubert | .................. | H01L 1/0021 101/28 |
| 7,343,857 B2* | 3/2008 | Sakuarai | ................. | B82Y 10/00 101/363 |
| 7,932,113 B1* | 4/2011 | Yee | ..................... | H01L 27/3211 257/E51.022 |
| 8,946,735 B2* | 2/2015 | Lee | ..................... | H01L 51/5265 257/40 |
| 2004/0062856 A1* | 4/2004 | Marcus | ............... | H01L 51/0002 427/66 |
| 2004/0108807 A1* | 6/2004 | Park | .................... | H01L 51/5203 313/504 |
| 2004/0113875 A1* | 6/2004 | Miller | ................ | G09G 3/3216 345/82 |
| 2005/0212728 A1* | 9/2005 | Miller | ................ | G09G 3/2003 345/76 |
| 2005/0245085 A1* | 11/2005 | Yoo | ........................ | B82Y 10/00 438/689 |
| 2005/0249972 A1* | 11/2005 | Hatwar | ............... | H01L 51/5265 428/690 |
| 2005/0285508 A1* | 12/2005 | Murayama | ........... | H01L 27/3211 313/503 |
| 2006/0021533 A1* | 2/2006 | Jeans | ....................... | B41K 1/02 101/327 |
| 2006/0081557 A1* | 4/2006 | Xu | ......................... | B82Y 10/00 216/48 |
| 2006/0125363 A1* | 6/2006 | Tahira | ................. | B41J 2/06 313/29 |
| 2006/0275674 A1* | 12/2006 | Kim | ..................... | B29C 59/026 430/5 |
| 2007/0019292 A1* | 1/2007 | Kim | ..................... | G02B 5/3058 359/487.03 |
| 2007/0196940 A1* | 8/2007 | Park | .................. | G02F 1/133516 438/22 |
| 2008/0090170 A1* | 4/2008 | Yoneda | ................. | B82Y 10/00 430/270.1 |
| 2008/0211133 A1* | 9/2008 | Terasaki | .............. | B29C 35/0888 264/219 |
| 2008/0261152 A1* | 10/2008 | Sugiyama | ............ | G11B 7/0079 430/296 |
| 2009/0057658 A1* | 3/2009 | Shin | .................... | H01L 51/0545 257/40 |
| 2009/0072228 A1* | 3/2009 | Choi | ................... | H01L 27/3262 257/40 |
| 2010/0032663 A1* | 2/2010 | Bulovic | .............. | H01L 51/0019 257/40 |
| 2010/0090341 A1* | 4/2010 | Wan | .................... | H01L 51/0003 257/749 |
| 2010/0108639 A1* | 5/2010 | Kasono | ............... | B29C 33/3878 216/41 |
| 2010/0127245 A1* | 5/2010 | Vaufrey | .............. | H01L 51/5012 257/40 |
| 2010/0149481 A1* | 6/2010 | Lee | ....................... | G03F 7/0017 349/187 |
| 2011/0114927 A1* | 5/2011 | Obana | ................. | H01L 27/3211 257/40 |
| 2011/0114974 A1* | 5/2011 | Song | ................... | H01L 51/5271 257/89 |
| 2011/0122358 A1* | 5/2011 | Kim | ..................... | G02F 1/13718 349/156 |
| 2011/0194751 A1* | 8/2011 | Takimoto | ................ | G06T 7/001 382/144 |
| 2011/0315077 A1* | 12/2011 | Asano | .................... | B82Y 10/00 118/504 |
| 2012/0326139 A1* | 12/2012 | Chen | ................... | H01L 51/0005 257/40 |
| 2013/0236999 A1* | 9/2013 | Lee | ....................... | G03F 7/0046 438/35 |
| 2014/0131684 A1* | 5/2014 | Prakash | .............. | H01L 51/0014 257/40 |
| 2015/0155493 A1* | 6/2015 | Cheng | ................. | H01L 51/56 438/35 |
| 2015/0179712 A1* | 6/2015 | Chien | ................. | H01L 27/3211 438/35 |

* cited by examiner

METHOD OF MAKING ORGANIC LIGHT EMITTING DIODE ARRAY

CROSS-REFERENCE TO RELATED APPLICATIONS

This application claims all benefits accruing under 35 U.S.C. §119 from China Patent Application No. 201310619394.4, filed on Nov. 29, 2013, in the China Intellectual Property Office, the disclosure of which is incorporated herein by reference.

FIELD

The present disclosure relates to a method of making organic light emitting diode array, particular to a method of making organic light emitting diode array based on nanoimprinting method.

BACKGROUND

Organic light emitting diodes are a type of light emitting diode that is made of thin films of organic molecules. A display screen using the organic light emitting diodes need no back light source, can save electric energy, and has greater angle of visibility. Thus, the organic light emitting diodes attract more and more attention.

A conventional method for making the organic light emitting diodes is to make a plurality of organic light emitting diodes on a base to form an array. The method includes: forming a thin-film transistor (TFT) array on the base; applying a first insulative layer on the thin-film transistor array; forming a plurality of first electrodes on the first insulative layer; applying a second insulative layer on the first insulative layer to cover the edges of each of plurality of first electrodes to expose the middle portion of each of plurality of first electrodes; depositing an organic light emitting layer on the middle portion of each of plurality of first electrodes; and making a second electrode on the organic light emitting layer. However, the organic light emitting layer is formed usually by vacuum evaporation which needs mask, high temperature, and vacuum device. Thus, the method is complicated and high cost.

What is needed, therefore, is to provide a method of making organic light emitting diode which can overcome the shortcomings as described above.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
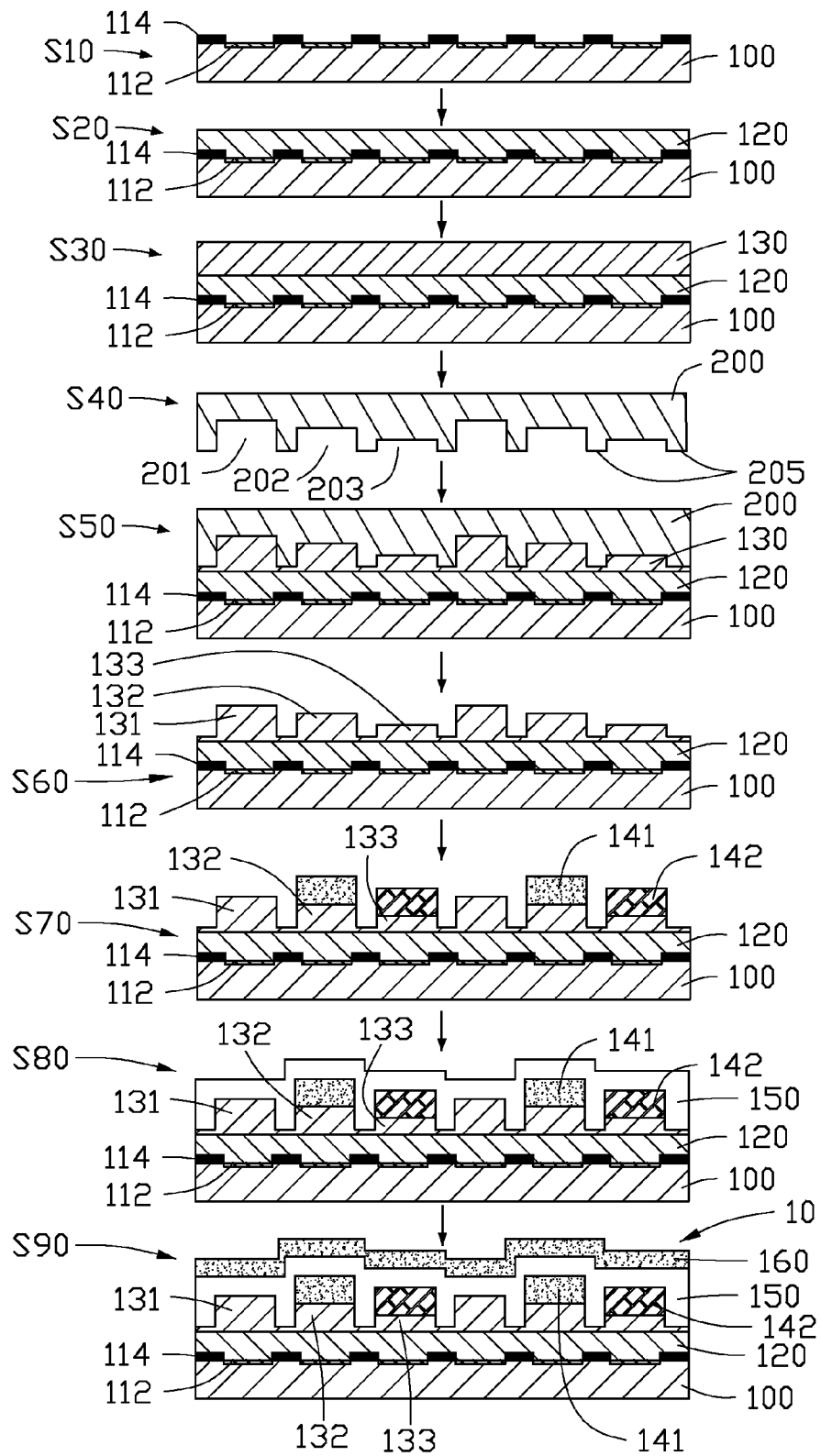
FIG. 1 shows a schematic flowchart of one embodiment of making an organic light emitting diode array.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "inside" indicates that at least a portion of a region is partially contained within a boundary formed by the object. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising" means "including, but not necessarily limited to"; it specifically indicates open-ended inclusion or membership in a so-described combination, group, series and the like. It should be noted that references to "an" or "one" embodiment in this disclosure are not necessarily to the same embodiment, and such references mean at least one.

Referring to FIG. 1, one embodiment of a method for making an organic light emitting diode array 10 comprises following steps:

(S10), providing a base 100 having a plurality of first electrodes 112 on a surface of the base 100;

(S20), depositing a first organic layer 120 on the surface of the base to cover the plurality of first electrodes 112;

(S30), forming a first organic light emitting layer 130 on the first organic layer 120;

(S40), providing a template 200 with a first patterned surface;

(S50), attaching the first patterned surface of the template 200 on the first organic light emitting layer 130 and pressing the template 200 toward the first organic light emitting layer 130;

(S60), forming a second patterned surface on the first organic light emitting layer 130 by separating the template 200 from the first organic light emitting layer 130, wherein the second patterned surface comprises a plurality of first protruding structures 131, a plurality of second protruding structures 132, and a plurality of second protruding structures 133 formed on the first organic light emitting layer 130;

(S70), depositing a second organic light emitting layer 141 on each of the plurality of second protruding structures 132, and depositing a third organic light emitting layer 142 on each of the third protruding structures 133;

(S80), forming a second organic layer 150 to cover the plurality of first protruding structures 131, each second light emitting layer 141, and each third light emitting layer 142; and (S90), forming a second electrode 150 electrically connected to the second organic layer 150.

In step (S10), the material of the base 100 can be glass, ceramic, silicon dioxide (SiO2), silicon nitride (SiN) or polymer. The plurality of first electrodes 112 is electrically connected to the first organic layer 120. The plurality of first electrodes 112 can supply driving current for the first electrodes 112, and control the working state of the organic light emitting diode array 10. The plurality of first electrodes 112 are electrical conductive layers and made of conductive oxide, such as indium tin oxide (ITO), indium zinc oxide (IZO), aluminum zinc oxide (AZO), zinc oxide (ZnO) or tin oxide (TO). The material of the first electrode 112 can also be metal such as gold, silver, aluminum, magnesium or alloy thereof. Thus the plurality of first electrodes 112 can also function as a reflecting layer. Furthermore, the plurality of first electrodes 112 can be made of carbon nanotube structure such as carbon nanotube wires or carbon nanotube film. The carbon nanotube structure is a free-standing structure capable of being directly attached on the base 100.

Furthermore, a plurality of barrier walls 114 can be formed on the surface of the base 100. One pixel is defined between every adjacent two of the plurality of barrier walls 114. Each of the plurality of first electrodes 112 is located between adjacent two barrier walls 114.

In step (S20), the first organic layer 120 can comprise a hole transport layer (HTL), or a hole injection layer (HIL). The material of the hole transport layer can be aromatic amines compounds such as Polyaniline (PAN) or triarylamine derivatives. The material of the hole injection layer can be Copper Phthalocyanine (CuPc). In one embodiment, the first organic layer 120 is a hole transport layer. The thickness of the hole transport layer can range from about 50 nanometers to about 300 nanometers.

In step (S30), The material of the first organic light emitting layer 130 can be any organic electroluminescent high or low molecular materials that can be made in to solution, such as polyfluorene (PF), or aluminum tris(8-hydroxyquinoline). The thickness of the first organic light emitting layer 130 can be in a range from about tens nanometers to about hundreds nanometers, for example, from about 15 nanometers to about 60 nanometers. In one embodiment, the thickness of the first organic light emitting layer 130 is about 40 nanometers.

The light emitting material of the first organic light emitting layer 130 can be a red-light-emitting material (R), a green-light-emitting material (G), or a blue-light-emitting material (B). The first organic light emitting layer 130 can cover the entire surface of the base 100.

Figure 2:
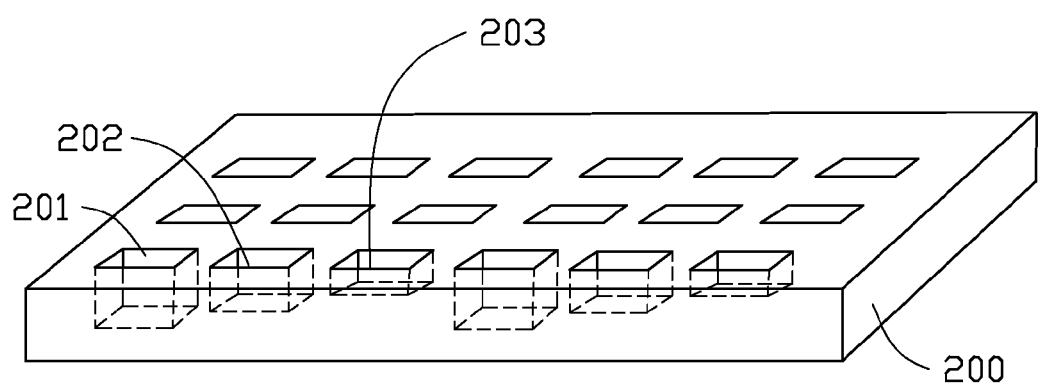
FIG. 2 shows a schematic view of one embodiment of a template with a plurality of convexities arranged in a two-dimensional array in the method of FIG. 1.

In step (S40), further referring to FIG. 2, the template 200 can be made of rigid materials, such as nickel, silicon, and carbon dioxide. The template 200 can also be made of flexible materials, such as PET, PMMA, polystyrene (PS), and polydimethylsiloxane (PDMS). The template 200 can be fabricated through an electron beam lithography method with the nano-pattern formed therein.

The first patterned surface of the template 200 defines a first nano-pattern. The first nano-pattern comprises a plurality of cavities aligned in an array. Furthermore, the first nano-pattern comprises a plurality of first nano-pattern units. The plurality of first nano-pattern units can be aligned in a one-dimensional array or a two-dimensional array. The plurality of first nano-pattern units can be aligned according to desire of the luminous effect of the organic light emitting diode array 10.

In one embodiment, each of the plurality of first nano-pattern unit comprises a first groove 201, a second groove 202, and a third groove 203 aligned side by side and spaced from each other. A Z-direction is defined as the direction perpendicular to the first patterned surface. An X-direction and a Y-direction are defined as direction parallel with the first patterned surface. The X-direction is perpendicular to the Y direction. Thus the plurality of first nano-pattern units can be aligned along the X direction to form the one-dimension array. The first groove 201, the second groove 202, and the third groove 203 in each of the plurality of first nano-pattern units can be aligned side by side in a fixed sequence. Thus in one embodiment, the plurality of first grooves 201, the plurality of second grooves 202, and the plurality of third grooves 203 can extend along the Y-direction and be alternately aligned side by side in a manner of "a1-a2-a3-a1-a2-a3 . . . " along the X-direction on the surface of the template 200.

Furthermore, the plurality of first nano-pattern unit can also be aligned in the manner of two-dimensional array with a plurality of rows and columns. Thus the plurality of first grooves 201, the plurality of second grooves 202, and the plurality of third grooves 203 can be alternately aligned in the manner of "a1-a2-a3-a1-a2-a3 . . . " along the X-direction. Furthermore, the plurality of first grooves 201, the plurality of second grooves 202, and the plurality of third grooves 203 can be alternately aligned in the manner of "a1-a2-a3 -a1-a2-a3 . . . " along the Y-direction.

In one embodiment, the plurality of first nano-pattern unit can also be aligned in the manner of two-dimensional array. The plurality of first grooves 201, the plurality of second grooves 202, and the plurality of third grooves 203 can be alternately aligned in the manner of "a1-a2-a3-a1-a2-a3 . . . " along the X-direction. Along the Y-direction, the plurality of first grooves 201 aligned in the same row have the same X coordinate, the plurality of second grooves 202 aligned in the same row have the same X coordinate, and the plurality of third grooves 203 aligned in the same row have the same X coordinate.

The first groove 201, the second groove 202, and the second groove 203 are spaced from each other with a certain distance. Each of the first groove 201, the second groove 202, and the second groove 203 is a concave. A protruding structure 205 is formed between adjacent two concaves.

The first groove 201, the second groove 202, and the third groove 203 have different depths which can be selected according to the thickness of the first organic light emitting layer 130, ensuring that first nano-pattern can be successively and completely transferred onto the first organic light emitting layer 130. In one embodiment, the first groove 201 has a first depth $d_1$; the second groove 202 has a second depth $d_2$, and the third groove 203 has a third depth $d_3$. The first depth $d_1$, the second depth $d_2$, and the third depth $d_3$ are not the same. In one embodiment, the first depth $d_1$, the second depth $d_2$, and the third depth $d_3$ are different from each other, thus $d_1 \neq d_2 \neq d_3$. Furthermore, the first depth $d_1$, the second depth $d_2$, and the third depth $d_3$ can also satisfy $d_1 \neq d_2 = d_3$, $d_1 = d_2 \neq d_3$, or $d_1 = d_3 \neq d_2$.

The minimum depth $d_{min}$ among the first depth $d_1$, the second depth $d_2$, and the third depth $d_3$ can be smaller than or equal to the thickness of the first organic light emitting layer 130. Furthermore, the maximum depth $d_{max}$ can be smaller than or equal to the thickness of the first organic light emitting layer 130. Thus the first nano-pattern of the template 200 can be precisely transferred to the first organic light emitting layer 130. In one embodiment, the first depth $d_1$, the second depth $d_2$, and the third depth $d_3$ are smaller than the thickness of the first organic light emitting layer 130. Furthermore, the first depth $d_1$, the second depth $d_2$, and the third depth $d_3$ satisfy $d_1 > d_2 > d_3$. The first depth $d_1$ can be smaller than or equal to 300 nanometers. The second depth $d_2$ can be greater than 50 nanometers and smaller than or equal to 300 nanometers. The third depth $d_3$ can be greater than 20 nanometers and smaller than or equal to 250 nanometers.

The cross section of the first groove 201, the second groove 202, or the third groove 203 along Z-direction can be in a shape of triangle, rectangle, circle, or square. In one embodiment, the cross section is in the shape of rectangle. A length of the rectangle can range from about 21 micrometers to about 122 micrometers. A width of the rectangle can range from about 5 micrometers to about 98 micrometers. The distance between the first groove 201, the second groove 202, and the third groove 203 can range from about 10 micrometers to about 89 micrometers. In one embodiment, the distance between the first groove 201, the second groove 202, and the third groove 203 is about 15 micrometers.

In step (S50), the template 200 is pressed towards the first organic light emitting layer 130 at room temperature. In one embodiment, the template 200 is pressed towards the first organic light emitting layer 130 at room temperature in a vacuum environment of about $1\times10^{-1}$ millibars to about $1\times10^{-5}$ millibars. The pressure applied on the template 200 is about 2 pounds per square inches to about 100 pounds per square inches. The pressure is applied on the template 200 for about 2 minutes to about 30 minutes.

During this process, the first organic light emitting layer 130 will be patterned. In one embodiment, each of the first groove 201, the second groove 202, and the third groove 203 faces to one of the plurality of first electrode 112. Thus a plurality of protruding structures will be formed on the first organic light emitting layer 130, and each of the plurality of protruding structures will be located on one of the first electrode 112. Furthermore, each of the plurality of protruding structures is located between adjacent two barrier walls 114. Thus the organic light emitting diode array 10 is convenient to be driven by the plurality of first electrodes 112.

In one embodiment, because of the first nano-pattern units in the first patterned surface of the template 200, the thickness of the first organic light emitting layer 130 at different portions will be gradually changed according to the depth difference between the first groove 201, the second groove 202, and the third groove 203.

During pressing the template 200 toward the first organic light emitting layer 130, because the first depth $d_1$, the second depth $d_2$, and the third depth $d_3$ satisfy $d_1>d_2>d_3$, the pressing process comprises three stages:

first stage, the third depth $d_3$ of the third groove 203 is smallest, thus a first portion of the first organic light emitting layer 130 corresponding to the third groove 203 will be pressed, and the thickness of the first portion will be getting thinner;

second stage, a second portion of the first organic light emitting layer 130 corresponding to the second groove 202 will be pressed, and the thickness of the second portion and the first portion will be getting thinner; and third stage, a third portion of the first organic light emitting layer 130 corresponding to the first groove 201 can be pressed.

Thus a plurality of second nano-pattern units will be formed on the surface of the first organic light emitting layer 130 according to the plurality of first nano-pattern units. The plurality of second nano-pattern units are coupled with the plurality of first nano-pattern units. Due to the plurality of first nano-pattern units form a two-dimensional array, the plurality of second nano-pattern units are also aligned along a two-dimensional array. In detail, each of the plurality of second nano-pattern units comprises a first protruding structure 131, a second protruding structure 132, and a second protruding structure 123. The first protruding structure 131 is coupled with the first groove 201. The second protruding structure 132 is coupled with the second groove 202. The third protruding structure 133 is coupled with the third groove 203.

Figure 3:
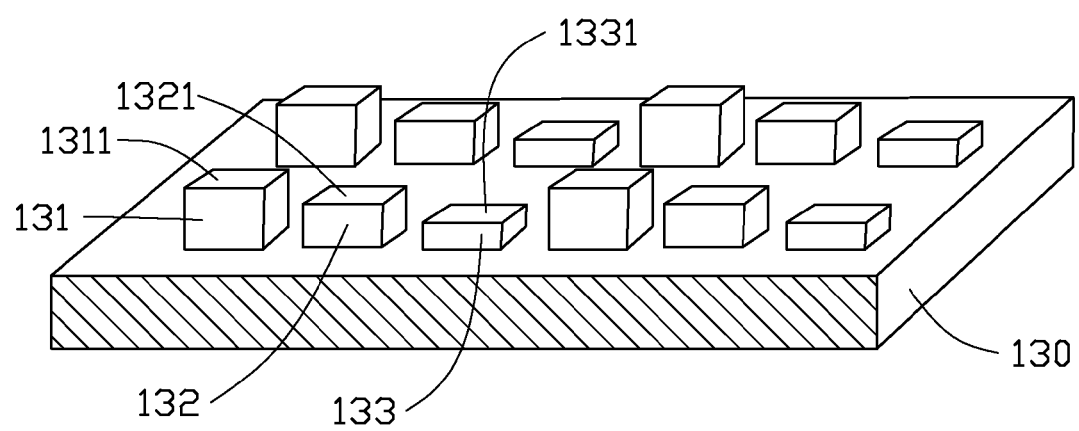
FIG. 3 shows a schematic view of one embodiment of a patterned first organic layer in the method of FIG. 1.

In step (S60), referring to FIG. 3, after the template 200 is separated, the first patterned surface is transferred to the first organic light emitting layer 130, and the second patterned surface of the first organic light emitting layer 130 is formed. The plurality of second nano-pattern units form the second patterned surface of the first organic light emitting layer 130. The first protruding structure 131, the second protruding structure 132, and the third protruding structure 133 are spaced from each other. The first protruding structure 131, the second protruding structure 132, and the third protruding structure 133 can be aligned in the manner of "a1-a2-a3-a1-a2-a3 . . . " along the X-direction. The first protruding structure 131, the second protruding structure 132, and the third protruding structure 133 can function as one pixel of the organic light emitting diode array 10.

The first protruding structure 131, the second protruding structure 132, and the third protruding structure 133 extend from the surface of the base 100. The heights of the first protruding structure 131, the second protruding structure 132, and the third protruding structure 133 cannot be same. In one embodiment, a first height $h_1$ of the first protruding structure 131, a second height $h_2$ of the second protruding structure 132, and a third height $h_3$ of the third protruding structure 133 are different from each other, thus $h_1 \neq h_2 \neq h_3$. Furthermore, the first height $h_1$, the second height $h_2$, and the third height $h_3$ can satisfy $h_1 \neq h_2 = h_3$, $h_1 = h_2 \neq h_3$, or $h_1 = h_3 \neq h_2$. In one embodiment, because the first depth $d_1$, the second depth $d_2$, and the third depth $d_3$ satisfy $d_1>d_2>d_3$, the first height $h_1$, the second height $h_2$, and the third height $h_3$ satisfy $h_1>h_2>h_3$.

Furthermore, during pressing the template 200, a fourth portion of the first organic light emitting layer 130 corresponding to the protruding structure 205 will be getting thinner and left on the base 100. Thus a step of removing residual fourth portion of the first organic light emitting layer 130 can be applied. The residual fourth portion can be removed via plasma etching. The second nano-pattern of the first organic layer is substantially not affected during the process of plasma etching.

In step (S70), the first protruding structure 131 has a first top surface away from the base 100, the second protruding structure 132 has a second top surface away from the base 100, and the third protruding structure 133 has third top surface away from the base 100. The second organic light emitting layer 141 is applied on the second top surface of the second protruding structure 132. The third organic light emitting layer 142 is applied on the third top surface. The second organic light emitting layer 141 and the third organic light emitting layer 142 can be applied via spinning method, inkjet printing method, or vacuum evaporation method. The first organic light emitting layer 130, the second organic light emitting layer 141, and the third organic light emitting layer 142 are spaced from each other.

The material of the second organic light emitting layer 141 and the third organic light emitting layer 142 can be any organic electroluminescent high or low molecular materials that can be made in to solution, such as polyfluorene (PF), or aluminum tris(8-hydroxyquinoline).

Furthermore, the thickness of the second organic light emitting layer 141, and the thickness of the third organic light emitting layer 143 can be same or different from each other. The thickness of the second organic light emitting layer 141 and the thickness of the third organic light emitting layer 142 can be in a range from about tens nanometers to about hundreds nanometers, for example, from about 50 nanometers to about 300 nanometers. In one embodiment, both the thickness of the second organic light emitting layer 141 and the thickness of the third organic light emitting layer 142 are about 25 nanometers.

The light emitting material of the first organic light emitting layer 130, the second organic light emitting layer 141, and the third organic light emitting layer 142 can be the same in order to emit same light such as red light, green light, blue light, or white light. Furthermore, the light emitting material of the first organic light emitting layer 130, the second organic light emitting layer 141, and the third organic light emitting layer 142 can be different to emit different lights.

The light emitting material of the first organic light emitting layer 130, the second organic light emitting layer 141, and the third organic light emitting layer 142 can be selected according to the first height $h_1$, the second height $h_2$, and the third height $h_3$. The light emitting material capable of emitting light with long wavelength can be applied on a higher protruding structure such as the first protruding structure 131. Thus the organic light emitting diode array 10 can uniformly emit white light.

In one embodiment, the light emitting material of the first organic light emitting layer 130 is a blue-light-emitting material (B). The light emitting material of the second organic light emitting layer 141 is a green-light-emitting material (G). The light emitting material of the third organic light emitting layer 142 is a red-light-emitting material (R).

The first organic light emitting layer 130, the second organic light emitting layer 141, and the third organic light emitting layer 142 can work together as one pixel unit, and each of the first organic light emitting layer 130, the second organic light emitting layer 141, and the third organic light emitting layer 142 is functioned as one sub-pixel. Furthermore, each of the first organic light emitting layer 130, the second organic light emitting layer 141, and the third organic light emitting layer 142 can also be functioned as one pixel unit.

In one embodiment, the first organic light emitting layer 130, the second organic light emitting layer 141, and the third organic light emitting layer 142 can be aligned in a manner of BGR-BGR-BGR . . . along the X-direction on the first organic layer 120.

Because the first protruding structure 131, the second protruding structure 132, and the third protruding structure 133 have different heights on the base 100. Thus the first organic light emitting layer 130, the second organic light emitting layer 141, and the third organic light emitting layer 142 have height difference from the surface of the base 100. Thus the luminesce effect of the organic light emitting diode array 10 can be improved.

In step (S80), the second organic layer 150 can be an electron transport layer (ETL) or an electron injection layer (EIL). The material of the electronic transport layer can be aromatic compounds with a larger conjugate planar. The material of the electronic injection layer can be alkali metal or alkali metal compounds with low work function, such as lithium fluoride (LiF), Calcium (Ca), Magnesium (Mg), etc. In one embodiment, the second organic layer 150 is an electronic transport layer. The second organic layer 150 can be merely located on top surfaces of the first protruding structure 131, the second organic light emitting layer 141, and the third organic light emitting layer 142. Because the first protruding structure 131, the second protruding structure 132, and the third protruding structure 133 have different heights, a surface of the second organic layer 150 away from the base 100 forms a patterned surface.

In step (S90), the second electrode 160 can be formed by deposition, evaporation, or printing. The second electrode 160 can be a transparent thin layer with low work function. The thickness of the second electrode 160 can range from about $5 \times 10^{-9}$ meters to about $30 \times 10^{-9}$ meters. Because the second electrode 160 is very thin with great transmittance, thus it does not affect the light-emitting efficiency of organic light-emitting diodes 10. The second electrode 160 can also be a stack structure with a variety of metal layers, such as lithium/aluminum/silver (Li/Al/Ag), calcium/aluminum (Ca/Al), or magnesium/silver (Mg/Ag). Furthermore, the second electrode 160 can comprise carbon nanotube yarns or carbon nanotube film.

The second electrode 160 and the first electrode 112 are worked together to provide voltage and current to the light emitting diode array 10. In one embodiment, the first electrode 112 is functioned as the anode of the organic light emitting diode array 10. The second electrode 160 is functioned as the cathode of the organic light emitting diode array 10.

While the material of the second electrode 160 is metal, the second electrode 160 can also be used as a reflector. The lights can be reflected by the second electrode 160 and emit from the surface of the base 100. Furthermore, a reflector layer (not shown) can be applied on the second electrode 160 to reflect the lights.

Furthermore, a thin film transistor (TFT) array can be applied on the base 100. The thin film transistor array is electrically connected to the plurality of first electrodes 112. Thus the working state of each organic light emitting diode in the organic light emitting diode array 10 can be controlled by the thin film transistor. Then the organic light emitting diode array 10 forms an active matrix organic light emitting diode (AMOLED) array.

Furthermore, a hole injection layer (not shown) can be applied on the surface of the base 100 before the step (S20).

Furthermore, an electron injection layer (not shown) can be applied on the surface of the second organic layer 150 before step (S70).

The method of making organic light emitting diode array 10 has following advantages. The plurality of protruding structures with different heights can be simply formed on the first organic layer via nano-imprinting method, thus the mask layer can be omitted. The damage to the first organic layer during changing the mask layer can be avoided. Thus the luminesce effect and life-span of the organic light emitting diode can be improved. The method is low in cost. Furthermore, because the nano-pattern of the template can have a high resolution, the resolution of the organic light emitting diode can have a resolution higher than 500 ppi (pixels per inch). The method of making organic light emitting diode can be suitable for roll-to-roll process, thus the production efficiency is improved.

It is to be understood that the described embodiments are intended to illustrate rather than limit the disclosure. Any elements described in accordance with any embodiments is understood that they can be used in addition or substituted in other embodiments. Embodiments can also be used together. Variations may be made to the embodiments without departing from the spirit of the disclosure. The disclosure illustrates but does not restrict the scope of the disclosure.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A method of making organic light emitting diode array, the method comprising:
   providing a base having a plurality of first electrodes on a surface of the base;
   depositing a first organic layer on the surface of the base so that the first organic layer is electrically connected to the plurality of first electrodes;
   applying a first organic light emitting layer on the first organic layer;
   providing a template with a first patterned surface;
   attaching the first patterned surface of the template on the first organic light emitting layer and pressing the template toward the first organic light emitting layer;
   forming a second patterned surface on the first organic light emitting layer by separating the template from the first organic light emitting layer, wherein a plurality of first protruding structures, a plurality of second protruding structures, and a plurality of third protruding structures are formed on a surface of the first organic light emitting layer away from the base;
   depositing a second organic light emitting layer on each of the plurality of second protruding structures, and depositing a third organic light emitting layer on each of the plurality of third protruding structures;
   forming a second organic layer to cover the plurality of first protruding structures, the second light emitting layer, and the third light emitting layer; and
   forming a second electrode electrically connected to the second organic layer.

2. The method of claim 1, wherein the first patterned surface defines a first nano-pattern comprising a plurality of first nano-pattern units spaced from each other.

3. The method of claim 2, wherein the plurality of first nano-pattern units are aligned in a one-dimensional array or a two-dimensional array.

4. The method of claim 2, wherein each of the plurality of first nano-pattern units comprises a first groove, a second groove, and a third groove aligned side by side and spaced from each other.

5. The method of claim 4, wherein the first groove, the second groove, and the third groove in each of the plurality of first nano-pattern units are aligned side by side in that sequence.

6. The method of claim 4, wherein a first depth $d_1$ of the first groove, a second depth $d_2$ of the second groove, and a third depth $d_3$ of the third groove are different.

7. The method of claim 6, wherein the first depth $d_1$ is smaller than or equal to 300 nanometers; the second depth $d_2$ is greater than 50 nanometers and smaller than or equal to 300 nanometers; the third depth $d_3$ is greater than 20 nanometers and smaller than or equal to 250 nanometers.

8. The method of claim 4, wherein a first depth $d_1$ of the first groove, a second depth $d_2$ of the second groove, and a third depth $d_3$ of the third groove satisfy $d_1>d_2>d_3$.

9. The method of claim 1, wherein the second patterned surface is coupled with the first patterned surface, and the second patterned surface comprises a plurality of second nano-pattern units spaced from each other.

10. The method of claim 9, wherein each of the plurality of second nano-pattern units comprises one of the plurality of first protruding structures, one of the plurality of second protruding structures, and one of the plurality of third protruding structure aligned side by side and spaced from each other.

11. The method of claim 10, wherein a first height $h_1$ of the first protruding structure, a second height $h_2$ of the second protruding structure, and a third height $h_3$ of the third protruding structure satisfy $h_1>h_2>h_3$.

12. The method of claim 10, wherein each of the plurality of first protruding structures has a first top surface away from the base, each of the plurality of second protruding structures has a second top surface away from the base, and each of the plurality of third protruding structures has a third top surface away from the base, the second organic light emitting layer is formed on the second top surface, and the third organic light emitting layer is formed on the third top surface.

13. The method of claim 1, wherein light emitting materials of the first organic light emitting layer, a second organic light emitting layer, and the third organic light emitting layer are different.

14. The method of claim 13, wherein the light emitting material of the first organic light emitting layer is a blue-light-emitting material, the light emitting material of the second organic light emitting layer is a green-light-emitting material, the light emitting material of the third organic light emitting layer is a red-light-emitting material.

15. The method of claim 1, wherein the second light organic light emitting layer and the third organic light emitting layer have the same thickness.

16. The method of claim 1, wherein the first electrode is formed by directly attaching a plurality of carbon nanotube wires or a carbon nanotube film on the base.

17. A method of making organic light emitting diode array, the method comprising:
   providing a base having a plurality of first electrodes on a surface of the base;
   depositing a first organic layer on the surface of the base to cover the plurality of first electrodes;
   depositing a first organic light emitting layer on the first organic layer;
   providing a template with a first patterned surface, wherein the first patterned surface comprises a plurality of first nano-pattern units aligned in an array, and each of the plurality of first nano-pattern units comprises a first groove, a second groove, and a third groove with different depths;
   attaching the first patterned surface of the template on the first organic light emitting layer;
   forming a second patterned surface on the first organic light emitting layer by pressing the template toward the first organic light emitting layer, and separating the template from the first organic light emitting layer, wherein the second patterned surface is coupled with the first patterned surface, and the second patterned surface comprises a plurality of second nano-pattern units aligned in an array, and each of the plurality of second nano-pattern units comprises a first protruding structure, a second protruding structure, and a third protruding structure with different heights;
   depositing a second organic light emitting layer on the second protruding structure, and depositing a third organic light emitting layer on the third protruding structure;
   forming a second organic layer on the first protruding structure, the second organic light emitting layer, and the third organic light emitting layer; and
   applying a second electrode electrically connected to the second organic layer.

18. A method of making organic light emitting diode array, the method comprising:
- providing a base having a plurality of first electrodes on a surface of the base;
- depositing a first organic layer on the surface of the base so that the first organic layer is electrically connected to the plurality of first electrodes;
- applying a first organic light emitting layer to cover the first organic layer;
- providing a template with a first patterned surface, wherein the first patterned surface comprises a plurality of first nano-pattern units aligned in an array, and each of the first nano-pattern units comprises a plurality grooves with different depths;
- attaching the first patterned surface of the template on the first organic light emitting layer and separating the template from the first organic light emitting layer, wherein a plurality of second nano-pattern units are formed on the first organic light emitting layer, each of the plurality of second nano-pattern units is configured as one pixel, and the pixel comprises a plurality of protruding structures with different heights ;
- depositing a second organic light emitting layer to cover a part of the plurality of protruding structures;
- forming a second organic layer on the first organic light emitting layer and the second organic light emitting layer; and
- applying a second electrode electrically connected to the second organic layer.

19. The method of claim 18, wherein a second patterned surface is formed on a surface of the second organic light emitting layer away from the base.

* * * * *